US007915928B2

(12) United States Patent
Wang

(10) Patent No.: US 7,915,928 B2
(45) **Date of Patent: *Mar. 29, 2011**

(54) HIGH LINEARITY VOLTAGE TO CURRENT CONVERSION

(75) Inventor: Dejun Wang, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 79 days.

This patent is subject to a terminal disclaimer.

(21) Appl. No.: 12/115,015

(22) Filed: May 5, 2008

(65) Prior Publication Data

US 2009/0273374 A1 Nov. 5, 2009

(51) Int. Cl.
*H03F 3/45* (2006.01)

(52) U.S. Cl. ........................................................ 327/103

(58) Field of Classification Search .................. 327/103
See application file for complete search history.

(56) References Cited

U.S. PATENT DOCUMENTS

| | | | | |
|---|---|---|---|---|
| 6,639,457 | B1 * | 10/2003 | Lou | 327/560 |
| 2007/0164799 | A1 * | 7/2007 | Weller et al. | 327/157 |
| 2008/0112712 | A1 * | 5/2008 | Inoue | 398/208 |

* cited by examiner

*Primary Examiner* — Lincoln Donovan
*Assistant Examiner* — Daniel Rojas
(74) *Attorney, Agent, or Firm* — Rahman LLC

(57) ABSTRACT

A system and method for performing voltage to current conversion, the system comprising of a first set of devices that senses the input voltage signal through its input terminal and replicates said input voltage across a second set of devices which then converts said replicated input voltage signal to an output current signal; a third set of devices that transfers the output current signal to output terminals; a differential feedback loop comprising an amplifier positioned between a first one of the first set of devices and a first one of the third set of devices; and a common mode feedback loop that regulates the output average voltage to a reference voltage.

13 Claims, 12 Drawing Sheets

HIGH LINEARITY VOLTAGE TO CURRENT CONVERSION

BACKGROUND

1. Technical Field

The embodiments herein generally relate to circuit design, and, more particularly, to voltage to current converters.

2. Description of the Related Art

Currently known circuit topologies for voltage to current converters suffer from poor linearity performance. Such linearity performance is because devices within circuits that interface with input serve two roles at the same time; sense the input signal and carry the output signal current. Since most silicon process technologies offer devices with a highly nonlinear input-output relationship such as CMOS or BIPOLAR, using devices for both sensing input voltage signal and current conversion results in poor linearity of such devices. For example, a CMOS device's output current versus its input gate to source voltage follows a square law relationship and a BIPOLAR device follows an exponential relationship that is highly non-linear in nature.

In high dynamic range continuous time Sigma Delta Analog-to-Digital Converters (ΣΔADCs) the obtainable signal resolution when it is quantization limited is proportional to the clock frequency that the loop filter can handle. Voltage to current converter stages are inherently faster than operational amplifiers (OPAMP) so there is a great interest to using voltage to current converters and capacitors to build the loop filter's integrators instead of resistors, capacitors, and OPAMPs. However, all current voltage to current converter topologies suffer from the fact that they have poor linearity performance compared to OPAMPs, even when signal swing is moderate (for example, 200 mV peak to peak differential). Poor linearity poses a bottleneck for performance improvement as improvements to the signal resolution are sought, which is usually defined as ENOB (effective number of bits) or SINAD (Signal to Noise and Distortion). Improvements are made to the signal resolution by using voltage to current converters and capacitors to build integrators. When voltage to current converters and capacitors are used to increase the system clock frequency for better quantization noise performance, the poor linearity caused by voltage to current converters will cause more distortion. The signal-to-noise ratio (SNR) and distortion will not improve due to the lower quantization noise because the distortion becomes the dominant factor.

Also, in many of today's radio frequency (RF)/wireless applications, filters that can operate at high frequencies are useful to filter out blockers and images, etc. However, if such filters have poor linearity, distortion introduced in such filters is likely to overwhelm the benefit of using them.

SUMMARY

In view of the foregoing, an embodiment herein provides a A system, method, and circuit for performing voltage to current conversion comprises a first and second set of devices, wherein the first set of devices sense an input voltage signal and replicate the input voltage signal across the second set of devices, and wherein the second set of devices convert the input voltage signal to an output current signal; a third set of devices that transfer the output current signal to output terminals; a negative feedback loop comprising an amplifier positioned between a first one of the first set of devices and a first one of the third set of devices; and a common mode feedback loop that regulates an output common mode voltage to a reference voltage. The first set of devices replicate the input voltage signal with high linearity across the second set of devices. Moreover, the second set of devices comprises resistors with high linearity that convert the input voltage signal to the output current signal.

The circuit may further comprise an input comprising p-type metal-oxide-semiconductor (PMOS) devices operatively connected to the first set of devices. Alternatively, the circuit may further comprise an input comprising n-type metal-oxide-semiconductor (NMOS) devices operatively connected to the first set of devices. Preferably, the negative feedback loop is operatively connected between one of the first set of devices and one of the third set of devices. Additionally, the common mode feedback loop is operatively connected to the output terminals, wherein the common mode feedback loop compares an average voltage of the output terminals to the reference voltage, and equalizes the output common mode voltage to the reference voltage.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
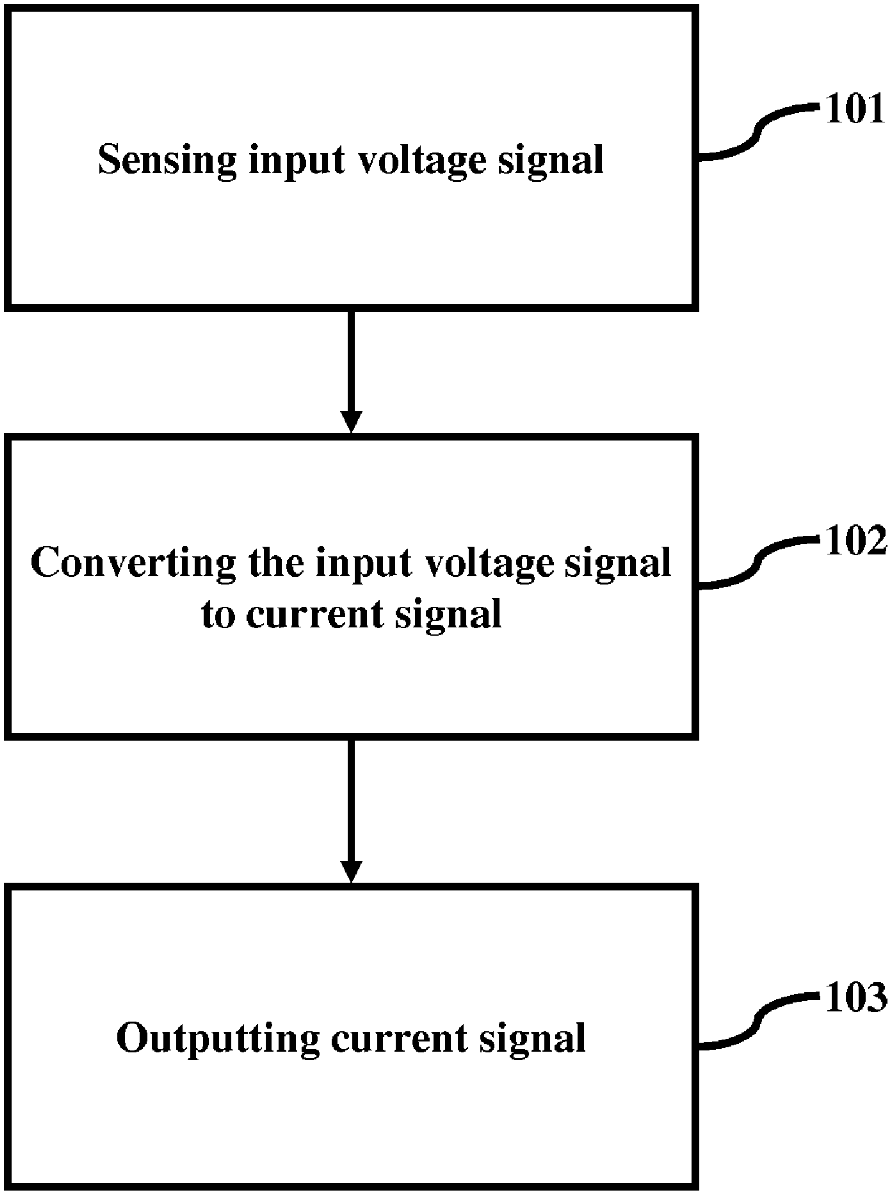
FIG. 1 is a flow diagram illustrating a method to perform voltage to current conversion according to the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein achieve a linear voltage to current converter by separating the sensing function and carrying output current function into two sets of devices. Referring now to the drawings, and more particularly to FIGS. 1 through 12, where similar reference characters denote corresponding features consistently throughout the figures, there are shown preferred embodiments.

The embodiments herein provide a voltage to current converter with one set of devices to sense a differential input voltage signal and a second set of devices to convert the differential input voltage signal into a differential output current signal and a third set of device to carry the differential output current. Separating the sensing function and output function into two sets of devices improves the linearity of the voltage to current converter.

FIG. 1 is a flow diagram illustrating a method to perform voltage to current conversion according to the embodiments herein. In the voltage to current converter, a first set of devices senses (101) the input voltage signal. A high gain loop around the first set of devices converts (102) a copy of the input voltage signal across a second set of devices, which may comprise resistors, to generate a current signal. A third set of devices are used to output (103) the current signal.

Figure 2:
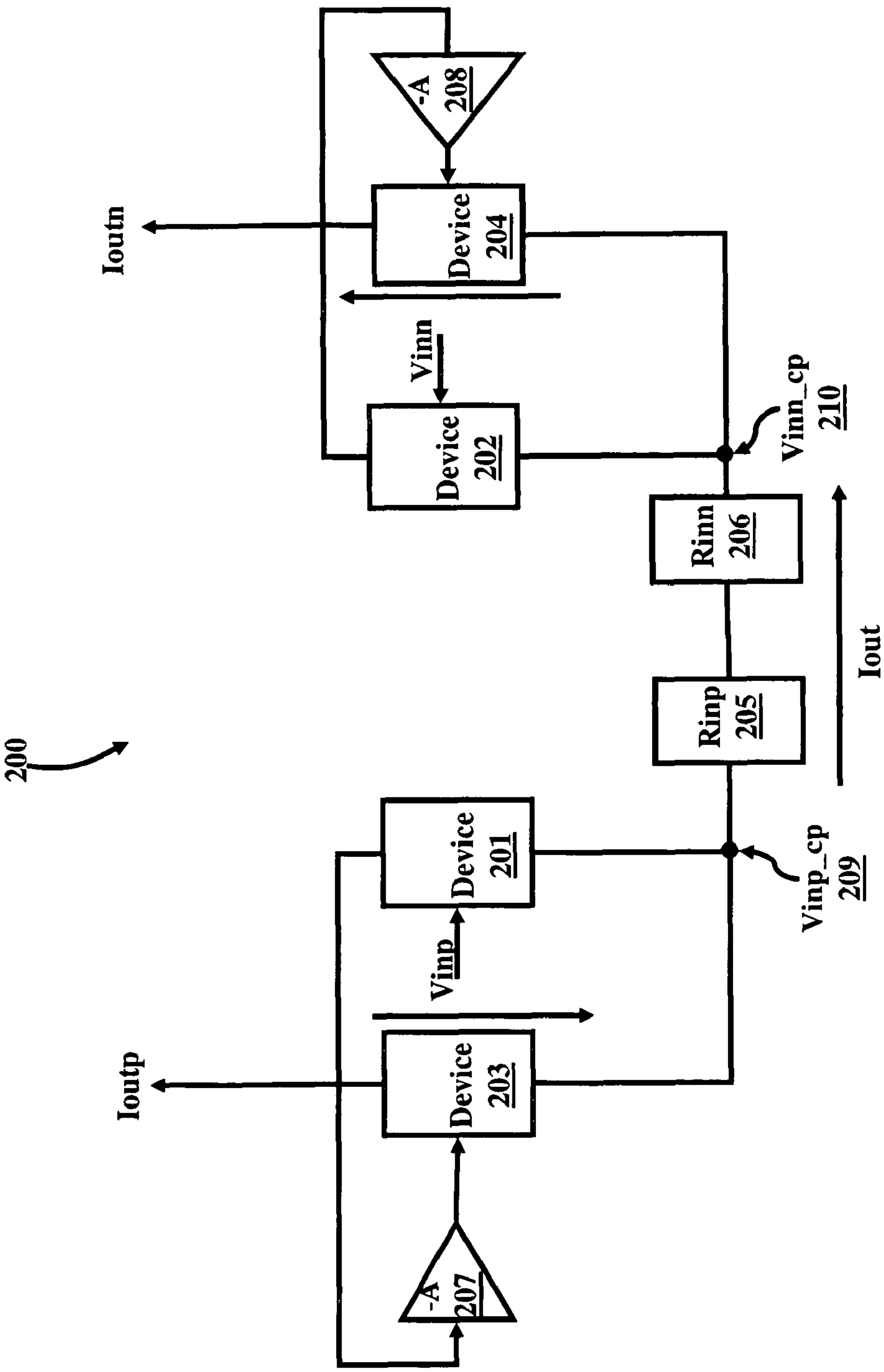
FIG. 2 is a schematic diagram of a voltage to current converter according to the embodiments herein.

FIG. 2 is a schematic diagram of a voltage to current converter 200 according to an embodiment herein. Devices 201, 202 are sensing devices that interface with the input voltage signal. Device 201 produces an exact copy of the input signal Vinp_cp at node 209 through a feedback loop around device 201. Device 202 produces an exact copy of the input signal Vinn_cp at node 210 through a feedback loop around device 202. If devices 201, 202 are metal oxide semiconductor (MOS) devices, then devices 201, 202 also provide capacitive input impedance. The voltage to current conversion is performed by Rinp 205 and Rinn 206, which are linear resistors. The current signal is linearly related to Vinp_Cp and Vinn_cp and obeys the following formula:

$$I_{DIFF} = \frac{V_{\text{inp\_cp}} - V_{\text{inn\_cp}}}{R_{inp} + R_{inn}}$$

Devices 203, 204 are output devices that carry the current signal to the output terminal Ioutp and Ioutn, respectively. Negative feedback loops with amplifiers 207, 208, which have a gain of −A, are formed between devices 201, 203 and between devices 202, 204, respectively. The negative feedback ensures that current can go through devices 203, 204, respectively.

Figure 3:
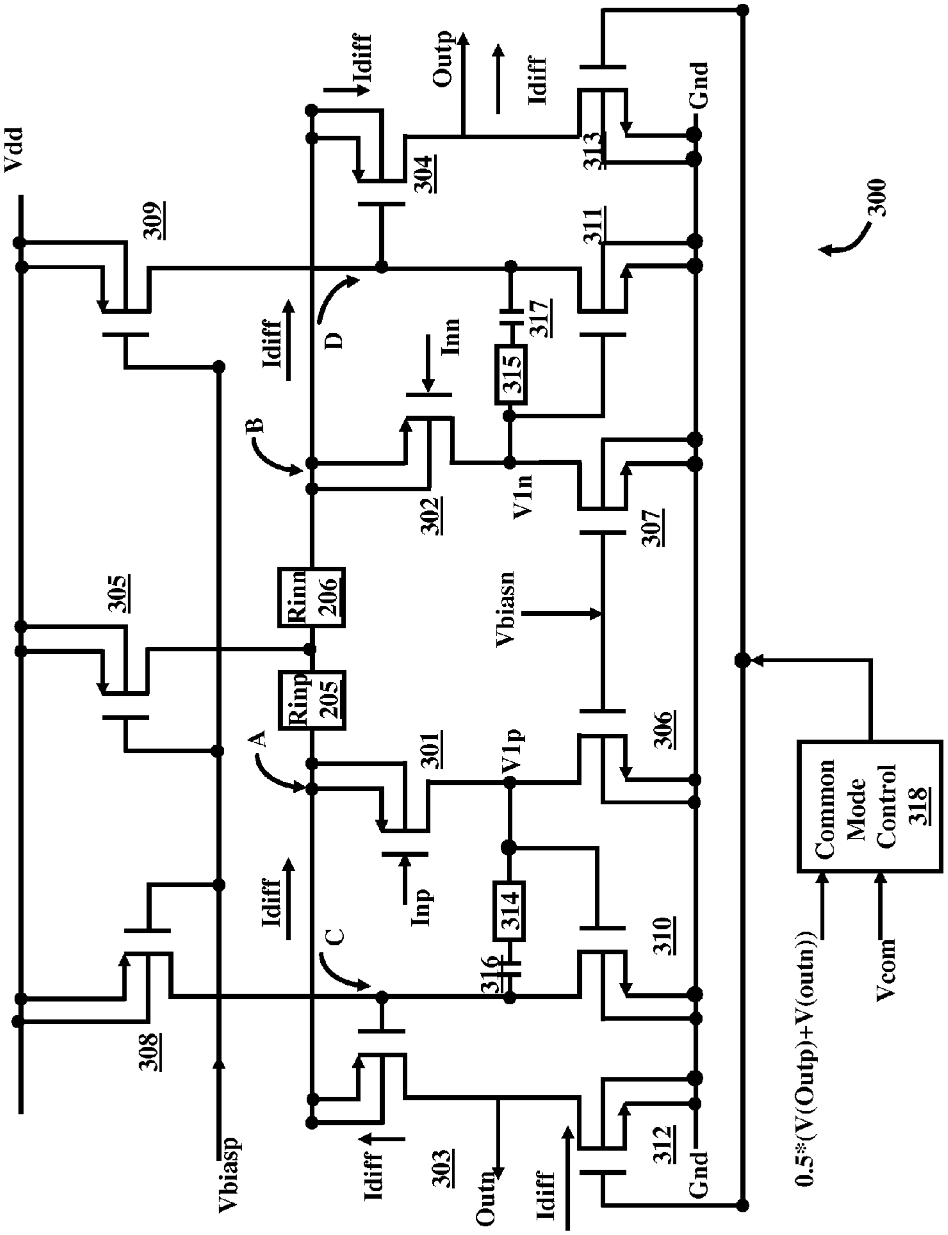
FIG. 3 illustrates a schematic diagram of a voltage to current converter using PMOS devices according to a second embodiment herein.

FIG. 3 illustrates a schematic diagram of a voltage to current converter 300 using PMOS devices according to an embodiment disclosed herein. The converter 300 is categorized into four distinctive groups: an input stage, a gain stage, a common mode feedback stage, and an output stage. The input stage comprises of devices 301, 302, 306, 307, Rinp 205, and Rinn 206. Devices 301, 302 interface with the input voltage signals Vinp and Vinn, respectively, to sense the input signals. Devices 301, 302 also provide capacitive input impedance. Devices 306, 307 serve as current sources and supply current to devices 301, 302. The bulk and source of devices 301, 302 are tied together to eliminate the body effect. In this regard, body effect refers to the phenomenon that the device's threshold changes due to a voltage difference between the source and body terminal of the devices.

The gain stage comprises of devices 308, 309, 310, 311, 314, 315, 316, and 317. Devices 308, 309 are bias devices and also function as load devices for the gain stage. Devices 310, 311 are active gain devices that sense the nodes V1*p* and V1*n*, respectively. Moreover, devices 310, 311 produce an inverted amplified copy of the voltage signal at V1*p* and V1*n* on nodes C and D, respectively. Devices 314, 315, 316, 317 are devices that provide compensation for the gain stage. Devices 314, 315 are resistors, while devices 316, 317 are capacitors.

The output stage comprises of device 303, 304, 312, and 313, which carry the current to the output terminals. The common mode feedback voltage stage 318 compares the average voltage of the output terminals Outp and Outn i.e. 0.5*(V(Outp)+V(Outn)) to a reference voltage Vcom, to control devices 312, 313 so that the output common mode voltage is equal to the reference voltage. The reference voltage Vcom supplied to the common mode feedback voltage stage 318 is approximately half of the power supply voltage. Since the current that goes through devices 301, 302 are fixed due to the nature of current sources; i.e., devices 306, 307, the device saturation voltage of devices 301, 302 is constant. Hence, an exact copy of the input signal Vinp and Vinn are reproduced across resistors Rinp 205 and Rinn 206 at nodes A and B, respectively, by the negative feedback.

The negative feedback is formed by devices 301, 306, 314, 316, 308, 310, 303 on the side of device 301 and by devices 302, 307, 315, 317, 309, 311, 304 on the side of device 302. The voltage is converted to current by the resistors Rinp 205 and Rinn 206 and the resulting differential output current goes through devices 303, 304, respectively. Since devices 312, 313 are current sources, the differential current goes to the output terminal Outp and Outn.

Figure 4:
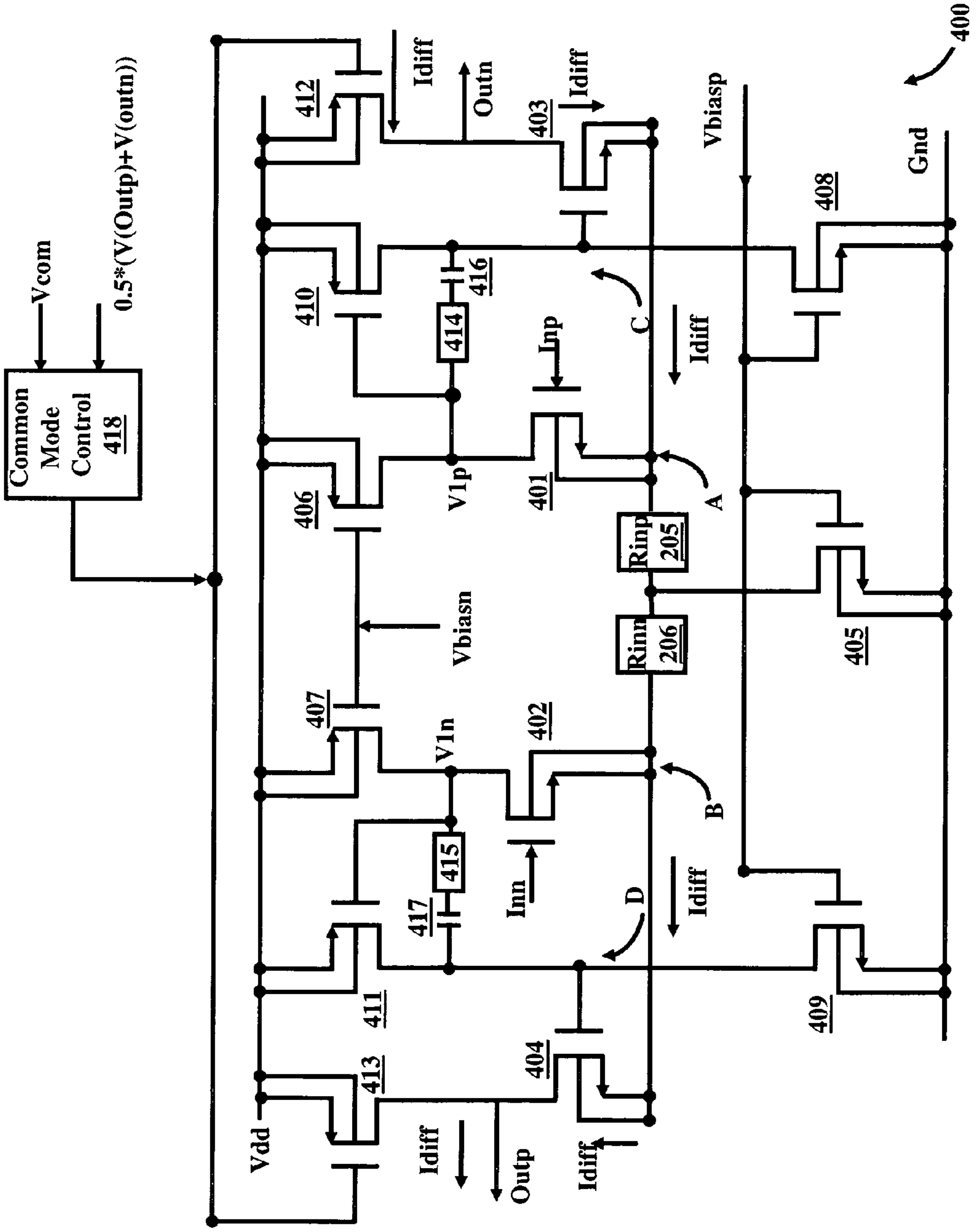
FIG. 4 illustrates a schematic diagram of a voltage to current converter using NMOS devices according to a third embodiment herein.

FIG. 4 illustrates a schematic diagram of a voltage to current converter 400 using NMOS devices according to an embodiment herein. The converter 400 is categorized into four distinctive groups: an input stage, a gain stage, a common mode feedback stage, and an output stage. The input stage comprises of devices 401, 402, 406, 407, Rinp 205, and Rinn 206. Devices 401, 402 interface with the input voltage signals Vinp and Vinn, respectively, to sense the input signals. Devices 401, 402 also provide capacitive input impedance. Devices 406, 407 serve as current sources and supply current to devices 401, 402. The bulk and source of devices 401, 402 are tied together to eliminate the body effect. Again, in this regard, body effect refers to the phenomenon that the device's threshold changes due to a voltage difference between the source and body terminal of the devices.

The gain stage comprises of devices 408, 409, 410, 411, 414, 415, 416, and 417. Devices 408, 409 are bias devices and also function as load devices for the gain stage. Devices 410, 411 are active gain devices that sense the nodes V1*p* and V1*n*, respectively. Furthermore, devices 410, 411 produce an inverted amplified copy of the voltage signal at V1*p* and V1*n* on nodes C and D, respectively. Devices 414, 415, 416, and 417 are devices that provide compensation for the gain stage. Devices 414, 415 are resistors, while devices 416, 417 are capacitors.

The output stage comprises of devices 403, 404, 412, and 413, which carry the current to the output terminals. The common mode feedback voltage stage 418 compares the average voltage of the output terminals Outp and Outn i.e. 0.5*(V(Outp)+V(Outn)) to a reference voltage Vcom, to control devices 412, 413 so that the output common mode voltage is equal to the reference voltage. The reference voltage Vcom supplied to the common mode feedback voltage stage 418 is approximately half of the power supply voltage. Since the current that goes through devices 401, 402 are fixed due to the nature of current sources; i.e., devices 406, 407, the device saturation voltage of devices 401, 402 is constant. Hence, an exact copy of the input signal Vinp and Vinn are reproduced across resistors Rinp 205 and Rinn 206 at nodes A and B, respectively, by the negative feedback.

The negative feedback is formed by devices 401, 406, 414, 416, 408, 410, and 403 on the side of device 401 and by devices 402, 407, 415, 417, 409, 411, and 404 on the side of device 402. The voltage is converted to current by the resistors Rinp 205 and Rinn 206 and the resulting differential output current goes through devices 403, 404, respectively. Since devices 412, 413 are current sources, the differential current goes to the output terminal Outp and Outn.

Figure 5:
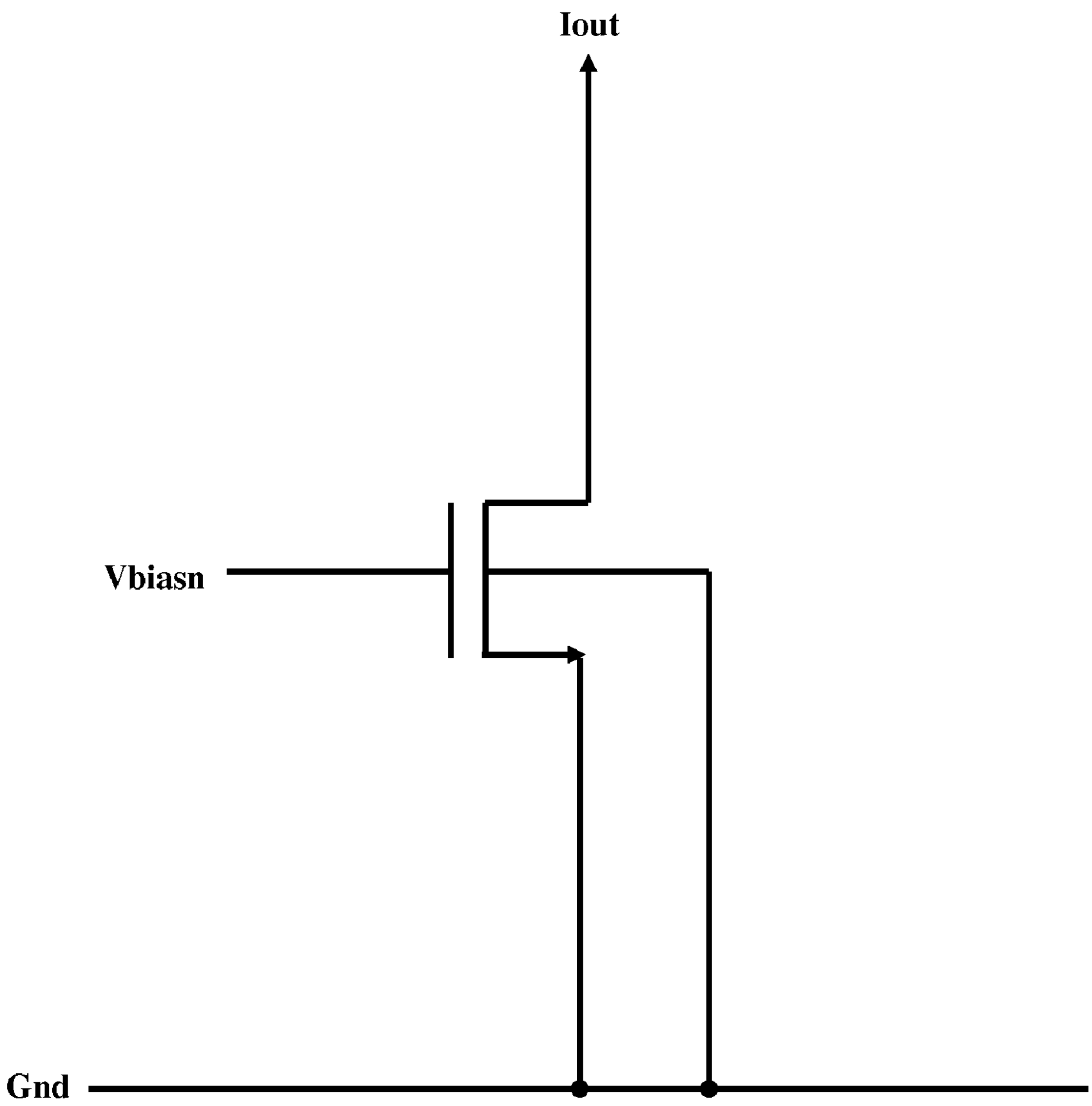
FIG. 5 illustrates a schematic diagram of a current source using NMOS devices according to an embodiment herein.
Figure 6:
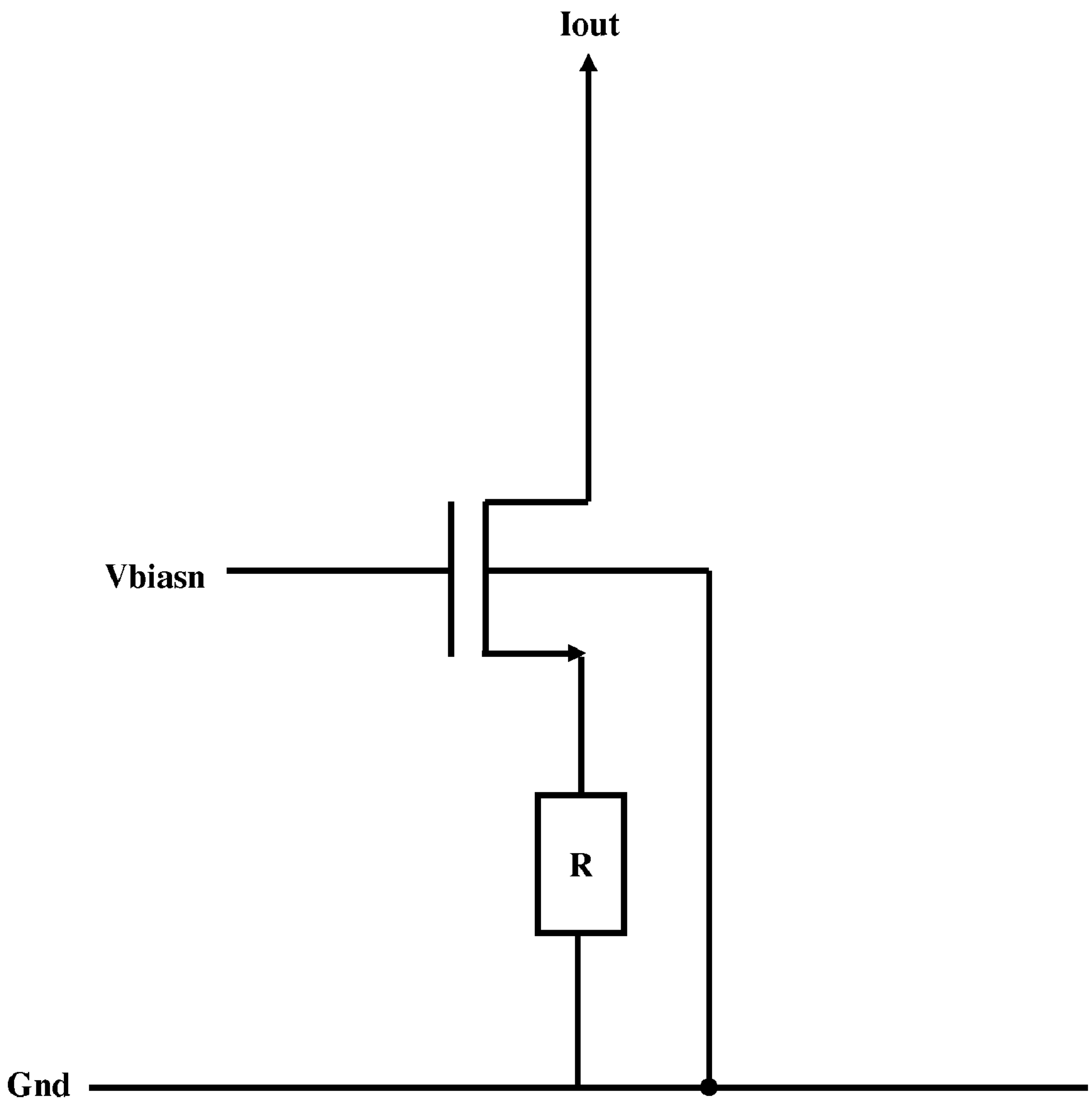
FIG. 6 illustrates a schematic diagram of a degenerated current source using NMOS devices according to an embodiment herein.
Figure 7:
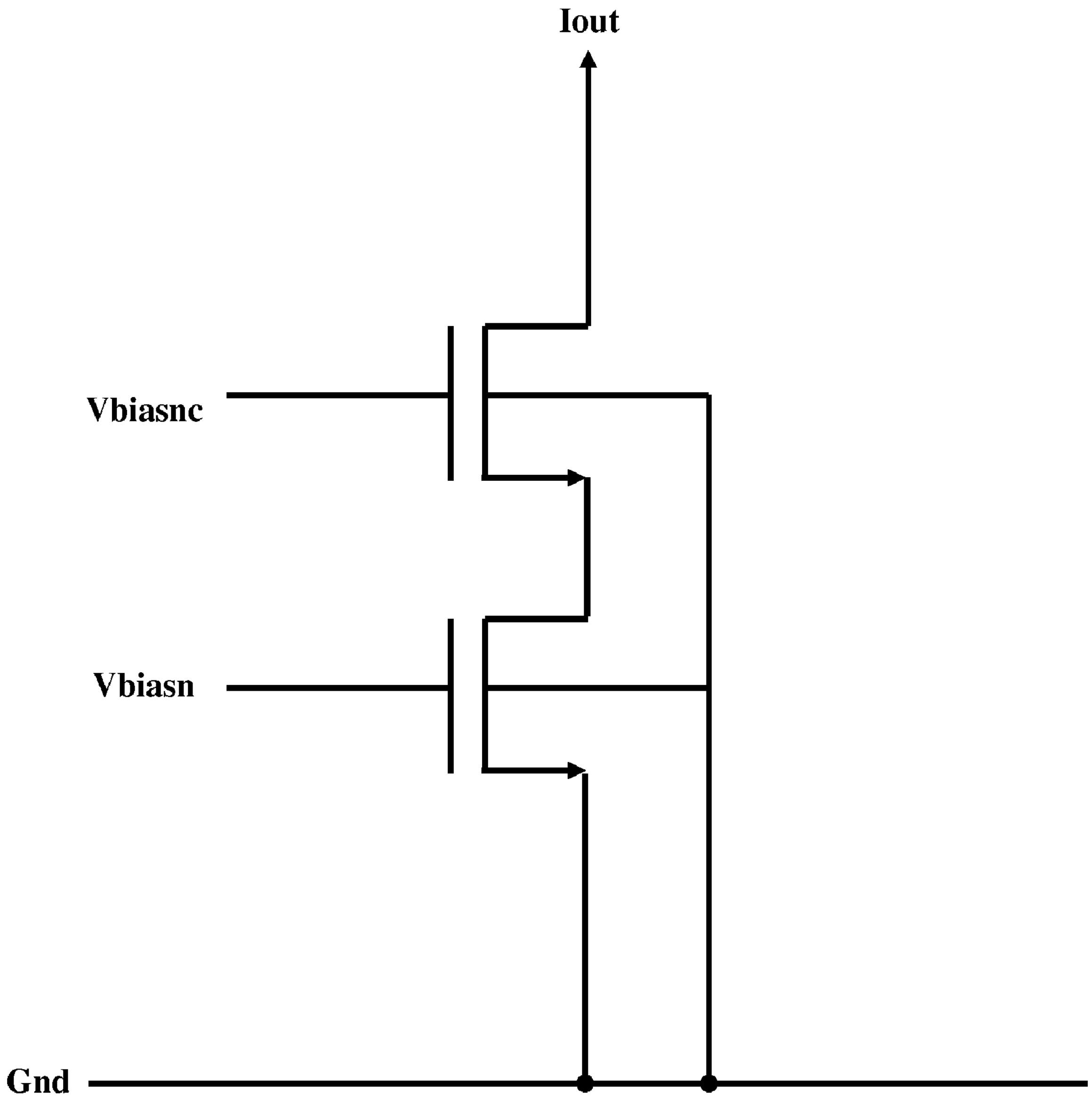
FIG. 7 illustrates a schematic diagram of a cascaded current source using NMOS devices according to an embodiment herein.
Figure 8:
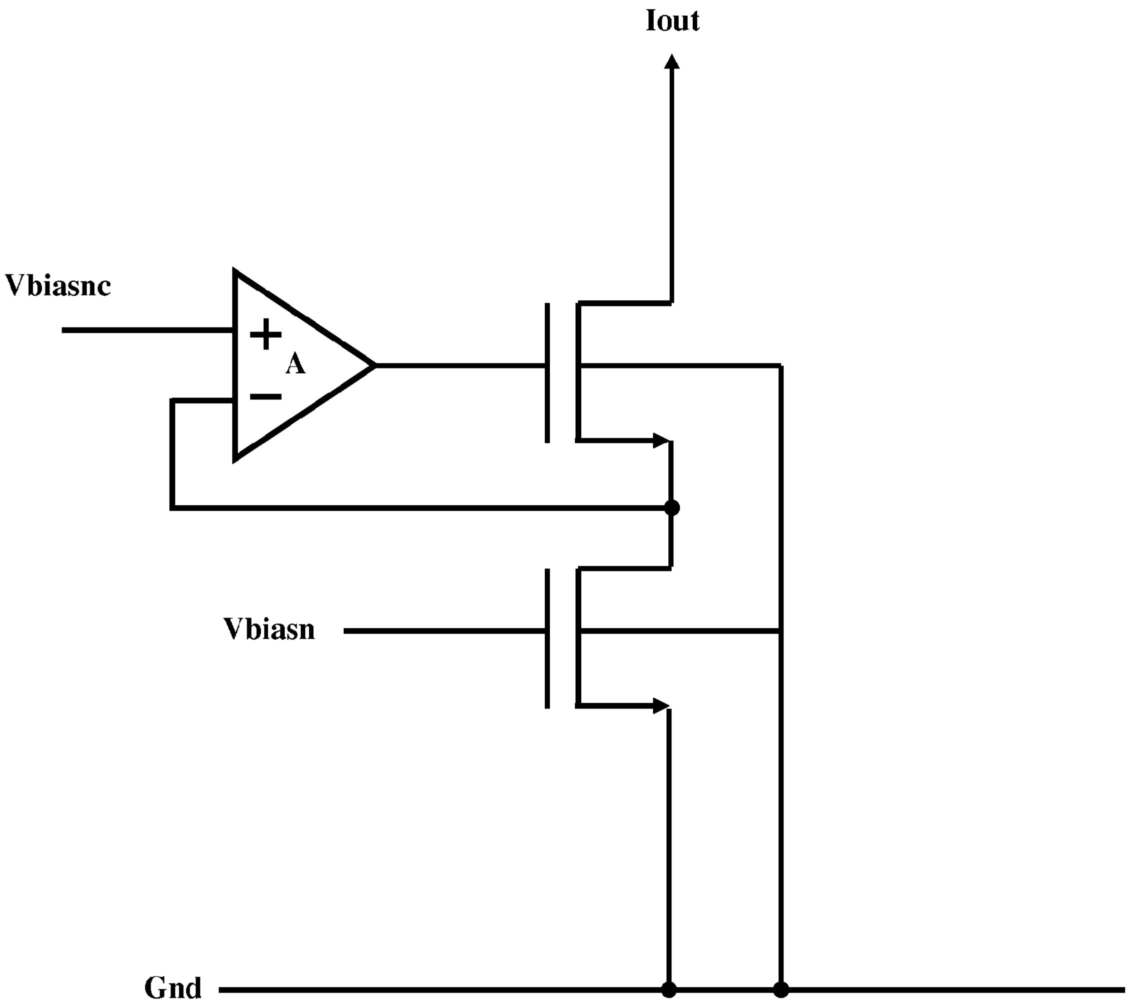
FIG. 8 illustrates a schematic diagram of a gain-boosted cascaded current source using NMOS devices according to an embodiment herein.
Figure 9:
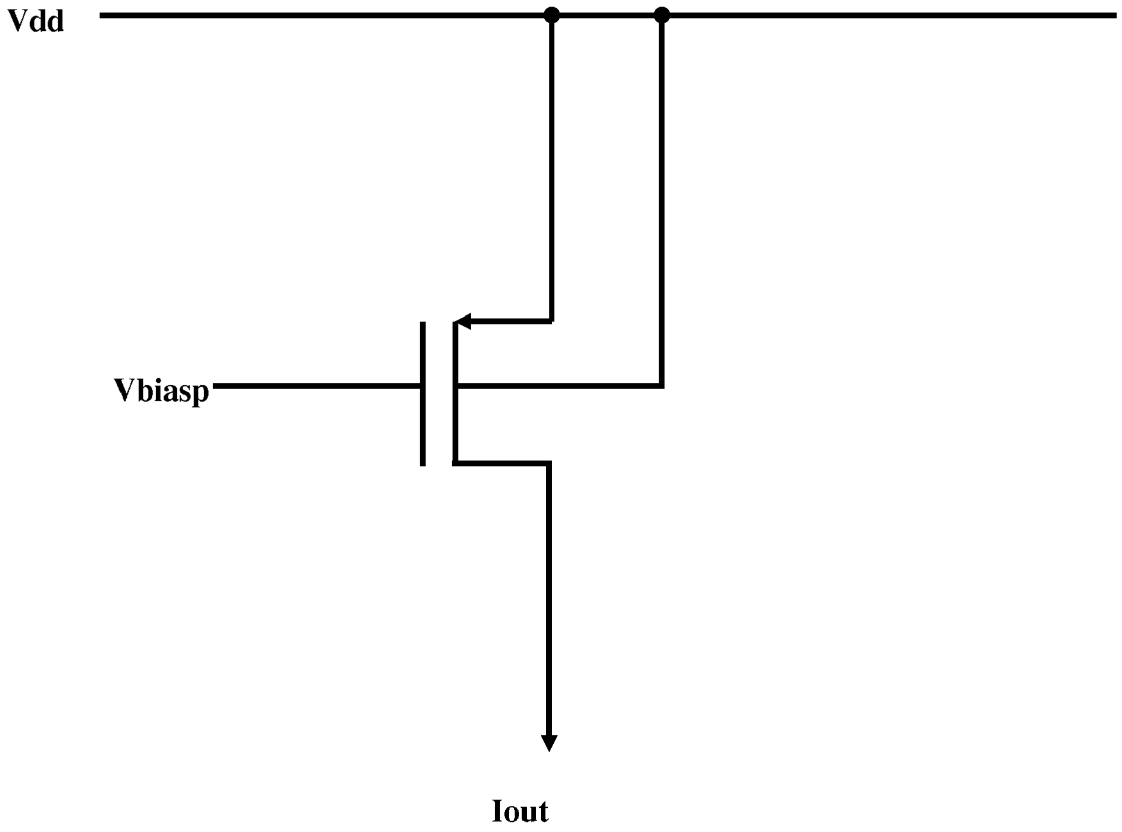
FIG. 9 illustrates a schematic diagram of a current source using PMOS devices according to an embodiment herein.
Figure 10:
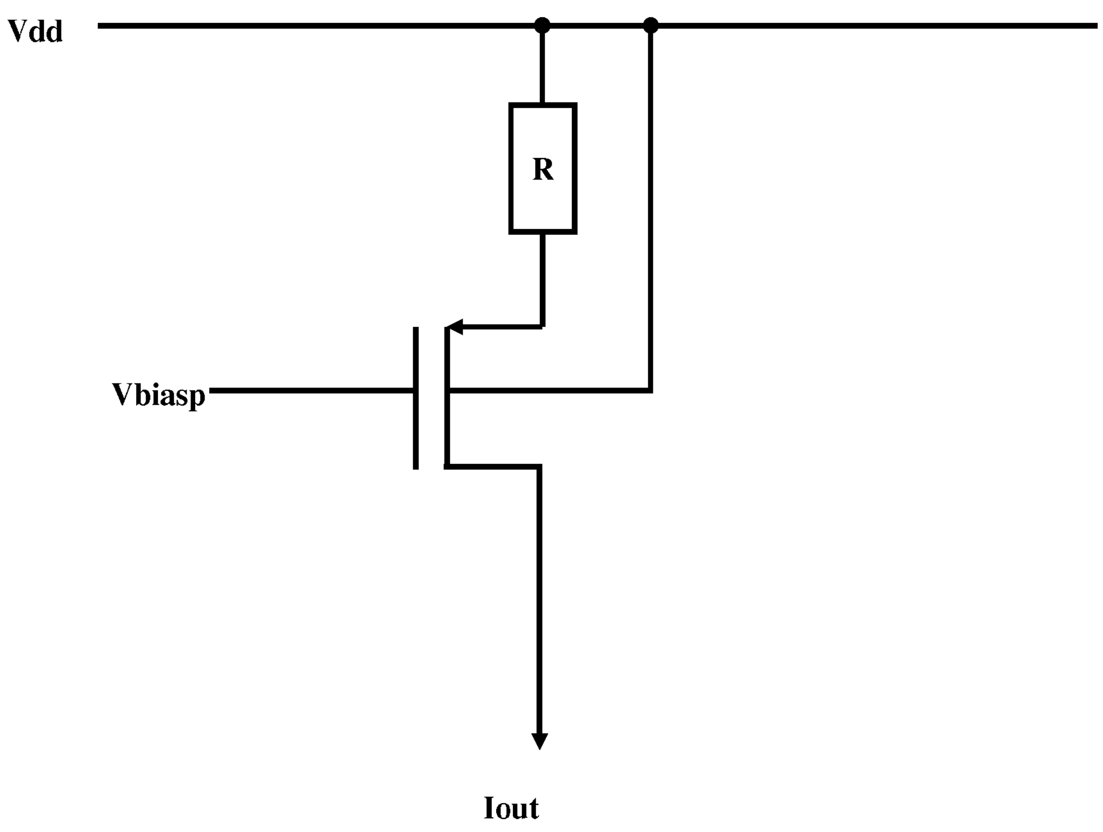
FIG. 10 illustrates a schematic diagram of a degenerated current source using PMOS devices according to an embodiment herein.
Figure 11:
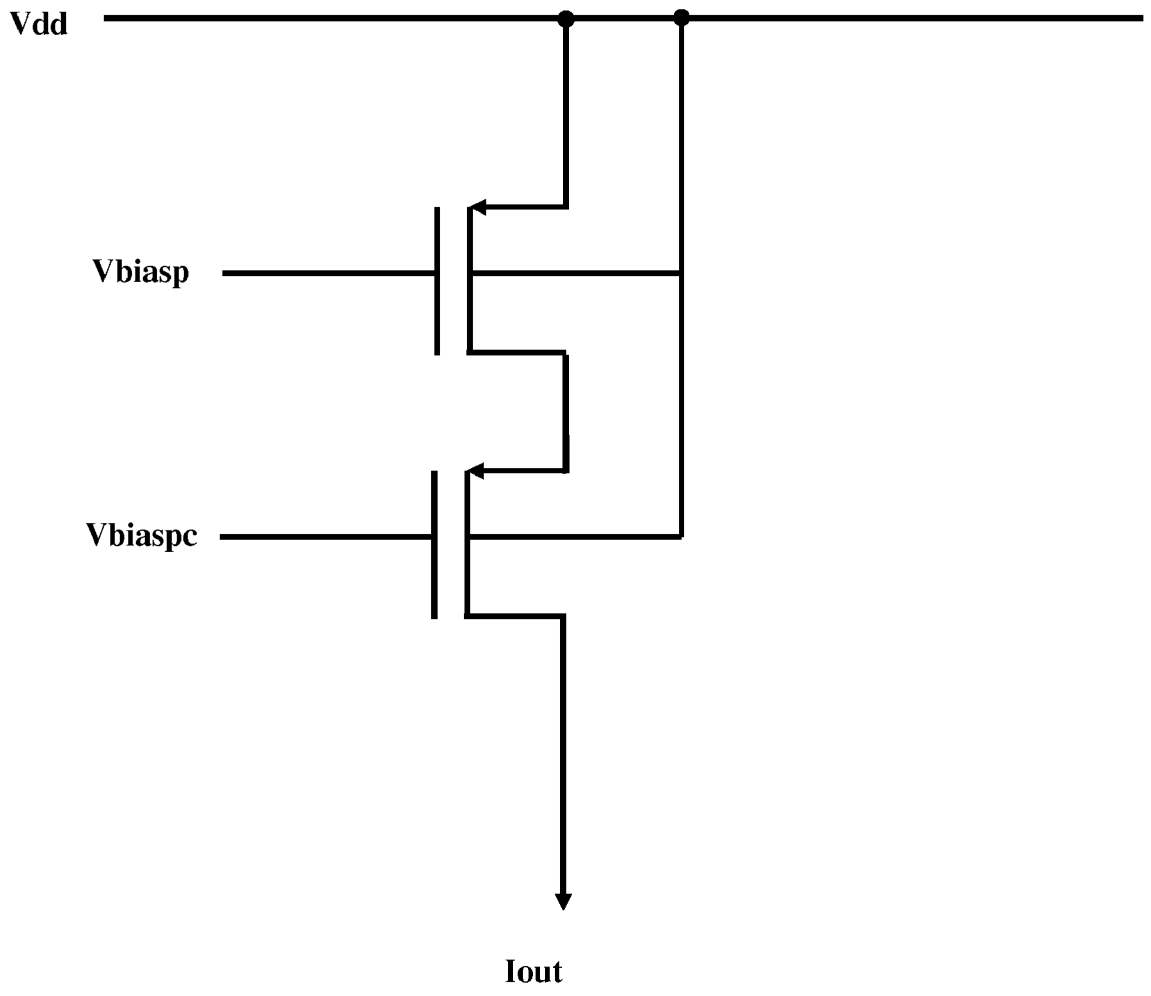
FIG. 11 illustrates a schematic diagram of a cascaded current source using PMOS devices according to an embodiment herein.
Figure 12:
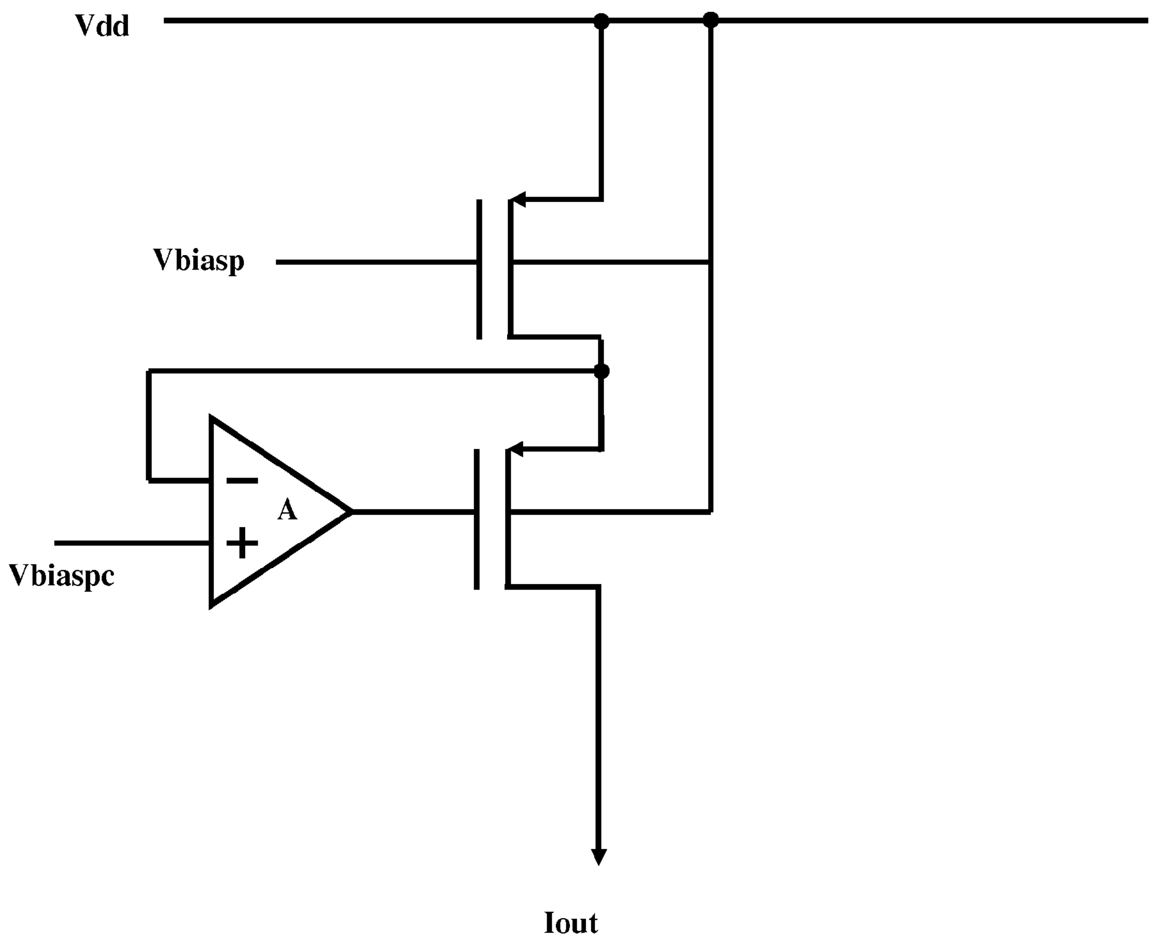
FIG. 12 illustrates a schematic diagram of a gain-boosted cascaded current source using PMOS devices according to an embodiment herein.

In FIG. 3, devices 305, 306, 307, 312, 313, 308, 309 act as current sources. In FIG. 4, devices 405, 406, 407, 412, 413, 408, 409 act as current sources. FIGS. 5 through 12 are alternative implementations of current sources. FIG. 5 illustrates a schematic diagram of a current source using NMOS devices. FIG. 6 illustrates a schematic diagram of a degenerated current source using NMOS devices (and resistor, R). FIG. 7 illustrates a schematic diagram of a cascaded current source using NMOS devices. FIG. 8 illustrates a schematic diagram of a gain-boosted cascaded current source using NMOS devices. FIG. 9 illustrates a schematic diagram of a current source using PMOS devices. FIG. 10 illustrates a schematic diagram of a degenerated current source using PMOS devices (and resistor, R). FIG. 11 illustrates a schematic diagram of a cascaded current source using PMOS devices. FIG. 12 illustrates a schematic diagram of a gain-boosted cascaded current source using PMOS devices. However, one skilled in the art would easily realize that the current sources as illustrated in FIGS. 5 through 12 are used only as examples and are not a restriction of the various embodiments as disclosed herein.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The embodiments herein may be manufactured in CMOS 65 nm processing. However, one skilled in the art would realize that CMOS is used only as an example and is not a restriction of the various embodiments as disclosed herein.

The embodiments herein allow for some previously impossible circuit topologies to become realized. For example, normally in wireless applications, after the mixer there is a post mixer amplifier to amplify the signal before the ADC converter quantize the signal. This is mainly due to the fact that a typical ADC's input referred noise and distortion is large and without gaining up the signal amplitude, the system performance will be severely degraded. However, according to the embodiments herein, the post mixer amplifier is completely eliminated due to the fact that the voltage to current converter is linear, which lowers distortion and also provides lower quantization noise. Also, the system ADC clock provided by the embodiments herein can be increased to several hundred megahertz and using relatively low power. This is impossible to implement using conventional OPAMP, resistor, and capacitor architectures. Conventional OPAMP type integrators consume an excessive amount of power once the clock is on the order of 200-300 MHz; e.g. consuming 10 s or even 100 s of miliamperes of current. According to the embodiments herein, each voltage to current converter consumes only 1 mA to achieve a speed of 600 MHz. For example, if the loop filter is $5^{th}$ order, then the total power will be on the order of 5 mA for a 600 MHz continuous time sigma delta ADC, which is a nearly a 40× improvement compared to conventional techniques.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A circuit for performing voltage to current conversion, said circuit comprising:

a first and second set of devices, wherein the first set of devices sense an input voltage signal and replicate said input voltage signal across said second set of devices to generate a linear voltage, and wherein the second set of devices comprise at least two resistors and a bias current split between said resistors, and wherein said resistors are connected in series and convert said input voltage signal to an output current signal;

a third set of devices that transfer said output current signal to output terminals;

a negative feedback loop comprising: said first set of devices; said second set of devices; and an amplifier positioned between a first one of said first set of devices and a first one of said third set of devices; and a common mode feedback loop that regulates an output common mode voltage from said output terminals to a reference voltage to control said output terminals and make said output common mode voltage equal to said reference voltage.

2. The circuit of claim 1, wherein said first set of devices replicate said input voltage signal with high linearity across said second set of devices, and wherein said first set of devices comprise p-type metal-oxide-semiconductor (PMOS) and n-type metal-oxide-semiconductor (NMOS) devices that provide capacitive input impedance.

3. The circuit of claim 1, further comprising an input comprising p-type metal-oxide-semiconductor (PMOS) devices operatively connected to said first set of devices.

4. The circuit of claim 1, further comprising an input comprising n-type metal-oxide-semiconductor (NMOS) devices operatively connected to said first set of devices.

5. The circuit of claim 1, wherein said common mode feedback loop is operatively connected to said output terminals, and wherein said common mode feedback loop compares an average voltage of said output terminals to said reference voltage, and equalizes said output common mode voltage to said reference voltage.

6. A system for performing voltage to current conversion, said system comprising:

a set of input devices comprising a first set of devices and a second set of devices, wherein said first set of devices receive an input voltage signal, sense said input voltage signal, and replicate said input voltage across said second set of devices to generate a linear voltage, and wherein said second set of devices comprise a plurality of resistors and a bias current split between said plurality of resistors, and wherein said plurality of resistors are connected in series and convert the replicated input voltage signal to an output current signal;

at least two output devices that output the current signal from the system;

a negative feedback loop comprising: said first set of devices; said second set of devices; and an inverted amplifier positioned between a first one of said first set of devices and a first one of said at least two output devices; and a common mode feedback loop that regulates an output common mode voltage from the output devices to a reference voltage to control said output devices and make said output common mode voltage equal to said reference voltage.

7. The system of claim 6, wherein said set of input devices comprise p-type metal-oxide-semiconductor (PMOS) devices.

8. The system of claim 6, wherein said set of input devices comprise n-type metal-oxide-semiconductor (NMOS) devices.

9. The system of claim 6, wherein said common mode feedback loop is operatively connected to said output terminals, and wherein said common mode feedback loop compares an average voltage of said output terminals to said reference voltage, and equalizes said output common mode voltage to said reference voltage.

10. The system of claim 6, wherein a device saturation voltage of said set of input devices is maintained constant by current sources of said set of input devices.

11. A method of performing voltage to current conversion, said method comprising:

receiving an input voltage signal from an electrical circuit;

sensing said input voltage signal using a first set of devices, wherein said first set of devices comprise at least a first bias current and a second bias current;

placing a replication of said input voltage signal across a second set of devices to generate a linear voltage, wherein said second set of devices comprise at least a pair of resistors and a bias current split between said pair of resistors;

converting said input voltage signal to an output current signal using said pair of resistors, wherein said pair of resistors are connected in series;

carrying said output current signal to output terminals of said electrical circuit using a third set of devices, wherein said output current signal is independent of a difference between said first bias current and said second bias current; carry said output current signal through a negative feedback loop comprising: said first set of devices; said second set of devices; and an amplifier positioned between a first one of said first set of devices and a first one of said third set of devices; and controlling a level of voltage through said electrical circuit using a common mode feedback loop that regulates an output common mode voltage from said output terminals to a reference voltage to control said output terminals and make said output common mode voltage equal to said reference voltage.

12. The method of claim 11, further comprising maintaining a constant device saturation voltage in said electrical circuit.

13. The method of claim 11, further comprising using metal-oxide-semiconductor (MOS) devices to receive said input voltage signal.

* * * * *